US005404025A

United States Patent [19]

Yamada

[11] Patent Number: 5,404,025

[45] Date of Patent: Apr. 4, 1995

[54] SEMICONDUCTOR VACUUM DEVICE WITH PLANAR STRUCTURE

[75] Inventor: Keizo Yamada, Tokyo, Japan

[73] Assignee: NEC Corporation, Tokyo, Japan

[21] Appl. No.: 51,356

[22] Filed: Apr. 23, 1993

[30] Foreign Application Priority Data

Apr. 24, 1992 [JP] Japan .............................. 4-105084

[51] Int. Cl.[6] ........................ H01L 27/24; H01S 3/08; H01J 1/46; H01J 1/02

[52] U.S. Cl. ........................................ 257/10; 257/41; 257/507; 359/293; 372/92; 372/99; 313/307; 313/355

[58] Field of Search .................... 257/10, 41; 359/293; 372/92, 99; 313/307, 355

[56] References Cited

U.S. PATENT DOCUMENTS 5,214,347 5/1993 Gray .................................. 313/355
5,227,699 7/1993 Busta .................................. 313/309

OTHER PUBLICATIONS

Vaudaine et al, "Microtips Fluorescent Display," IEDM Dec. 1991, pp. 197-200.

Gray et al, "Film Edge Emitters: The Basis for a New Vacuum Transistor" IEDM, Dec. 1991, pp. 201-204.

Jiang et al, "GaAs Planar-Doped-Barrier Vacuum Microelectronic Electron Emitters," IEEE Electron Device Letters, vol. 14, No. 3, Mar. 1993, pp. 143-145.

H. F. Gray et al., "A Vacuum Field Effect Transistor Using Silicon Field Emitter Arrays," Naval Research Lab., Washington, D.C., *IEDM Technical Digest*, 1986, pp. 776-779.

C. A. Spindt, "A Thin-Film Field-Emission Cathode," *Journal of Applied Physics—Communications*, vol. 39, 1968, pp. 3504-3507.

*Primary Examiner*—Mahshid D. Saadat
*Attorney, Agent, or Firm*—Burns, Doane, Swecker & Mathis

[57] ABSTRACT

A semiconductor vacuum device including a semiconductor substrate 3, an insulator film 2 formed on the substrate 3, and a single crystal semiconductor film 1 formed on the insulator film 2. The single crystal semiconductor film 1 has a first and a second tapered edge opposite to one another but spaced apart over a gap formed in the insulator film 2. The first tapered edge acts 6 as a cathode and the second tapered edge acts as a gate 7, the substrate 1 acting as an anode into which said electrons emitted from the cathode above.

9 Claims, 4 Drawing Sheets

SEMICONDUCTOR VACUUM DEVICE WITH PLANAR STRUCTURE

BACKGROUND OF THE INVENTION

1. Field of the Invention

The present invention relates to a vacuum device and a fabrication method thereof and more particularly, to a vacuum device having a first terminal from which electrons can be emitted and a second terminal into which the electrons flow, and a fabrication method thereof.

2. Description of the Related Art

Recently, vacuum devices of this sort have been developed, which are fabricated by utilizing micro processing techniques generally used in the field of semiconductor devices. The vacuum device is different from a conventional vacuum tube in that the device utilizes a cold cathode. That is, in the conventional vacuum tube, a filament is heated so that electrons are thermally excited to be emitted therefrom into a vacuum space. On the other hand, in the vacuum device, no filament is provided, but a cathode having a particular configuration is provided so that a large electric field can be generated around the cathode, thereby causing electrons to be emitted from the cathode. Generally, the cathode is pyramidal shaped and the edge thereof is sharp. The sharpness of the edges is important to the device characteristics and their radius of curvature should be several hundreds angstroms or less.

Conventionally, two methods of forming the cathode are known, one of which was developed by Spindt et al., Stanford Research Institute. In the method, an aluminum film is formed on a rotating insulator substrate which is supported obliquely by the vacuum evaporation technique thereby forming a sacrificial layer having a visor and thereafter, a metal having a high melting-point such as molybdenum is deposited on the sacrificial layer. Then, the aluminum sacrificial layer is removed to obtain a pyramidal shaped and sharp-edged cathode (see J. Appl. Phys. Vol. 39, pp3504, 1968).

The other method was developed by Gray et al, Naval Research Laboratory, in which a pyramidal shaped and sharp-edged cathode is obtained by utilizing the anisotropic etching technique of silicon (see IEDM Tech. Dig., pp776, 1986). The processes of the method are shown in FIGS. 1A to 1E.

First, a single-crystal silicon substrate 72 is prepared and a silicon nitride film 71 is formed thereon by the Chemical Vapor Deposition (CVD) technique, as shown in FIG. 1A. Then, as shown in FIG. 1B, the nitride film 71 is removed except for a portion in which a sharp-edged pyramidal cathode is to be formed, and the substrate 72 is anisotropically etched by using an anisotropic etching solution such as hydrazine, ethylene diamine or the like. When a predetermined time is passed, the etching of the substrate 72 is stopped thereby a pyramidal portion 73 being obtained, as shown in FIG. 1C. Gray et al was utilized the portion 73 thus obtained.

Next, to make the pyramidal portion 73 more sharp-edged, the substrate 72 is thermally oxidized to form an silicon oxide film 74 thereon. As a result, the pyramidal portion 73 of silicon is made more sharp-edged, as shown in FIG. 1D.

To make a gate, a silicon oxide film 76 is deposited on the silicon oxide film 74 and the silicon nitride film 71 shown in FIG. 1D by the CVD technique and then, a molybdenum film 75 is formed on the film 76 by the vacuum evaporation technique, the state of which at this time is shown in FIG. 1E.

Finally, the nitride film 71, the oxide film 76 and the molybdenum film 75 placed on the top of the pyramidal portion 73 are removed by the lift off method thereby the surface of the portion 73 being exposed. Thus, the vacuum device is obtained. The oxide film 76 and the molybdenum film 75 remain except those on the portion 73. The remained portion of the film 75 acts as a gate.

With the above-described method using the anisotropic etching technique of silicon, there are problems in that it is very difficult to obtain the sharp-edged pyramidal portion with a reduced dispersion and that the prior art requires complex technology for performing the method.

In addition, there is another problem that the positions of the cathode and gate cannot be set with accuracy and without restraint.

SUMMARY OF THE INVENTION

Therefore, an object of the present invention is to provide a vacuum device having a first terminal with a tapered sharp edge from which electrons can be emitted and a second terminal into which the electrons can flow, and the positions of the edge can be set with accuracy and without restraint.

Another object of the present invention is to provide a fabrication method of a vacuum device having the above structure with a good reproducibility and without complex know-hows.

According to a first aspect of the present invention, a vacuum device is provided, which includes an insulator film formed on a semiconductor substrate, a first terminal made of a semiconductor layer formed on the insulator film having a tapered edge from which electrons can be emitted, and a second terminal into which the electrons flow.

With the vacuum device of the present invention, the first terminal, generally called a "cathode", of the semiconductor layer with the tapered edge is formed on the semiconductor substrate through the insulator film, so that if the semiconductor layer is selectively removed by the anisotropic etching technique, the tapered edge with sharpness can be obtained easily.

Besides, since the etching action of the substrate can be stopped by the insulator film, the etching depth can be set accurately. Therefore, if a portion of the substrate to be etched is designed appropriately, the position of the edge can be set with accuracy and without restraint.

A third terminal for controlling the electron flow, generally called a "gate", may be provided in the vicinity of the tapered edge of the first terminal. The gate preferably has a tapered edge similar to the edge of the first terminal, or cathode, and the edge of the third terminal, or gate, is preferably arranged in the vicinity of the edge of the cathode. In this case, there is an advantage that the electron flow from the first terminal can be controlled by using the third terminal thereby obtaining an anode current with good efficiency.

The second terminal, generally called "anode", may be formed by the substrate in itself and be formed separately by a semiconductor layer or other electroconductive film or the like.

Preferably, there is a void in the insulator film in the vicinity of the edge of the cathode so that the surface of the substrate is exposed through the void. A fluorescent material may be placed in the void and in this case, the anode is preferably placed at a position opposite to the cathode with respect to the fluorescent material. The electrons emitted from the cathode and flow toward the anode collide with the fluorescent material on the way thereby light having a particular energy being generated. Thus, a light-emitting vacuum device can be obtained.

The fluorescent material may be placed on a supporting plate which is fixed on the cathode and having the anode made of an electroconductive film, instead of the void. The electrons are accelerated in a vacuum space formed between the substrate and the plate, and thereafter collide with the fluorescent material. Light with larger intensity can be obtained.

The second terminal, or the anode, and the supporting plate are preferably transparent so that the light may be emitted from the device therethrough.

Preferably, a thin insulator film is provided on the cathode so as to cover the fluorescent material disposed in the vicinity of the edge of the cathode, and the second terminal, or anode, is provided on the insulator film. The anode may be made thin enough for the electrons from the cathode being transmitted therethrough, instead of the anode being provided so as to cover the fluorescent material, and the fluorescent material may be disposed on the thin anode.

Further, in case that a pair of mirrors forming an optical resonator is provided and the fluorescent material is placed between the mirrors, the vacuum device has a laser function. Since the resonance frequency of the resonator can be made equal to or nearly equal to that of the oscillator circuit, there is an advantage that a laser with good efficiency can be obtained.

In addition, a conventional laser device generally needs a gallium arsenide (GaAs) system material, however, with the device of the invention, a laser device of sufficient performance can be obtained by using silicon, so that there is an advantage that good compatibility with a silicon LSI can be realized thereby an optical integrated circuit being made easily.

According to a second aspect of the present invention, a fabrication method of the vacuum device is provided, which uses a so-called "Semiconductor On Insulator (SOI)" substrate. In the method, a semiconductor layer formed on a semiconductor substrate through an insulator film is selectively removed by the anisotropic etching technique so that a tapered edge of the semiconductor layer is formed and the insulator film is partially exposed from the semiconductor layer.

As known well, for example, when a single-crystal silicon layer of (100)-orientation is selectively removed by using an anisotropic etching solution such as an alkali solution, an oblique surface of the silicon layer can be formed easily. The oblique surface is of (111)-plane accurately. Therefore, if the etching depth is controlled, the configuration of the tapered edge to be formed can be accurately determined. That is, the configuration of the edge to be obtained by the anisotropic etching can be approximately constant. Besides, the configuration can be controlled in the order of an atomic size and the edge can be very sharp.

Accordingly, by the method of the invention, a cathode with a tapered sharp edge can be formed in the semiconductor layer. Since the etching depth of the semiconductor layer is automatically restrained by the insulator film, superior reproducibility can be realized even if the thickness of the semiconductor layer is small.

Other semiconductors than silicon may be used as the semiconductor layer, if an oblique surface thereof can be obtained by the anisotropic etching technique.

Preferably, a silicon layer of a (100)-orientation having a thickness of approximately 1 $\mu$m is used.

For example, if the semiconductor layer is anisotropically etched to form a concavity with a letter V cross-section therein whose width at the upper face of the layer is several micrometers, the distance between the cathode and the gate can be made approximately 1 $\mu$m and the edges of the cathode and the gate can be sharp. If the thickness of the semiconductor layer is 1 $\mu$m or less, the distance can be made narrower.

There may be provided with a step of placing the fluorescent material so that the electrons emitted from the first terminal, or the cathode, are collide with the material. The device with a light-emitting function can be fabricated.

Further, there may be provided with steps of placing a pair of mirrors forming an optical resonator and of placing the fluorescent material between the mirrors. The device with a laser function ca be fabricated.

With the method of the present invention, the vacuum device of the present invention can be obtained easily.

BRIEF DESCRIPTION OF THE DRAWINGS

FIGS. 2A to 2F are views of a vacuum device according to a first embodiment of the present invention showing the fabrication process of the device, in which FIGS. 2A to 2E are respectively cross-sectional views and FIG. 2F is a plan view.

DESCRIPTION OF THE PREFERRED EMBODIMENTS

Figure 1A:
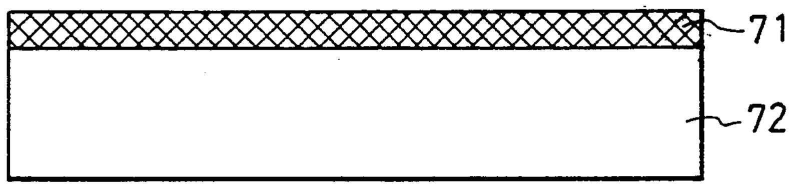
FIG.1A PRIOR ART
FIGS. 1A to 1E are respectively cross-sectional views of a vacuum device showing a conventional fabrication method thereof.
Figure 1B:
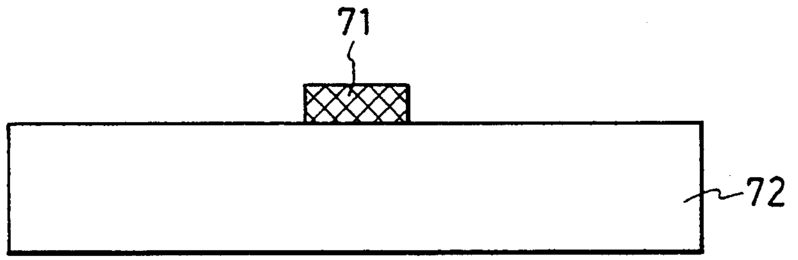
FIG.1B PRIOR ART
Figure 1C:
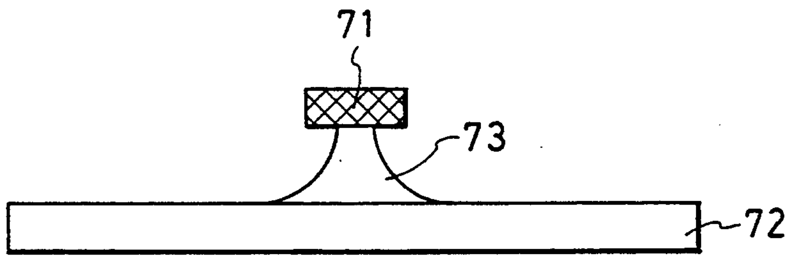
FIG.1C PRIOR ART
Figure 1D:
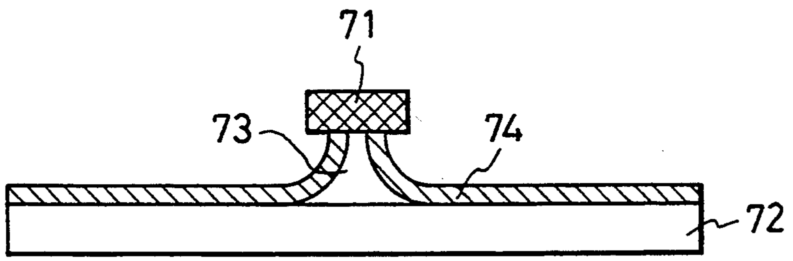
FIG.1D PRIOR ART
Figure 1E:
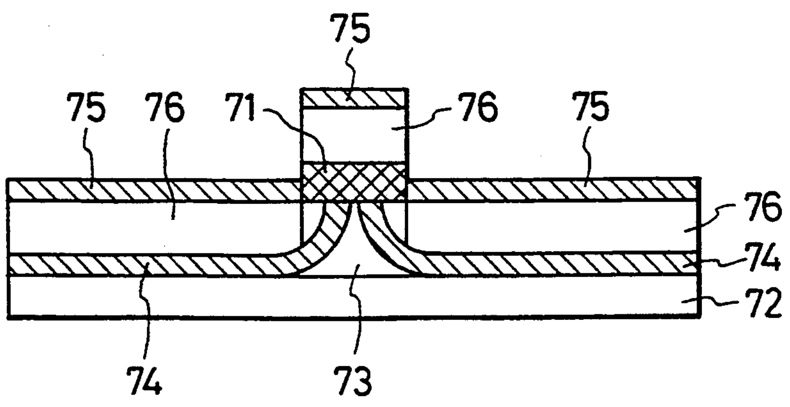
FIG.1E PRIOR ART

Preferred embodiments of the present invention will be described below while referring to the drawings attached.

FIRST EMBODIMENT

Figure 2A:
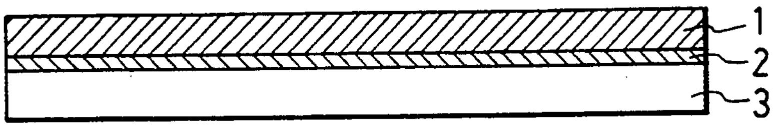
Figure 2B:
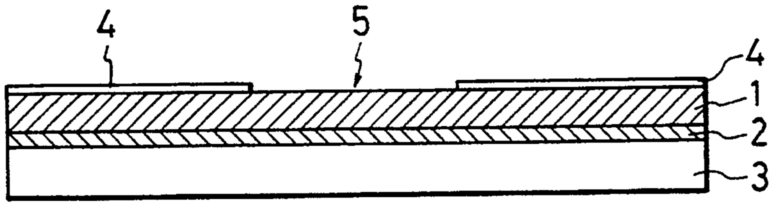
Figure 2C:
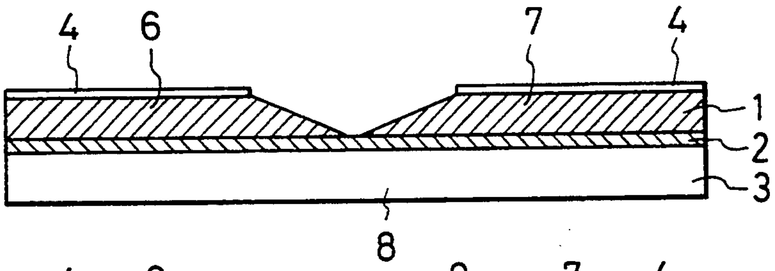
Figure 2D:
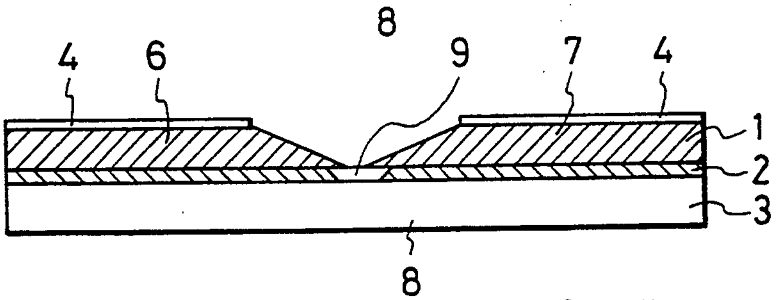
Figure 2E:
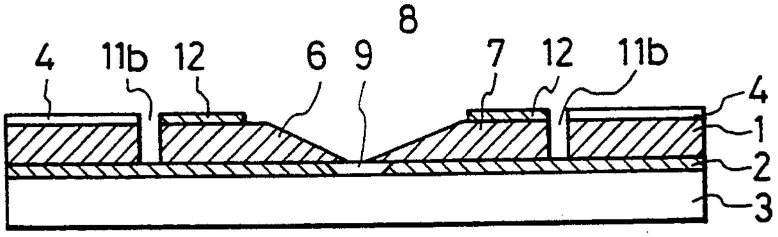
Figure 2F:
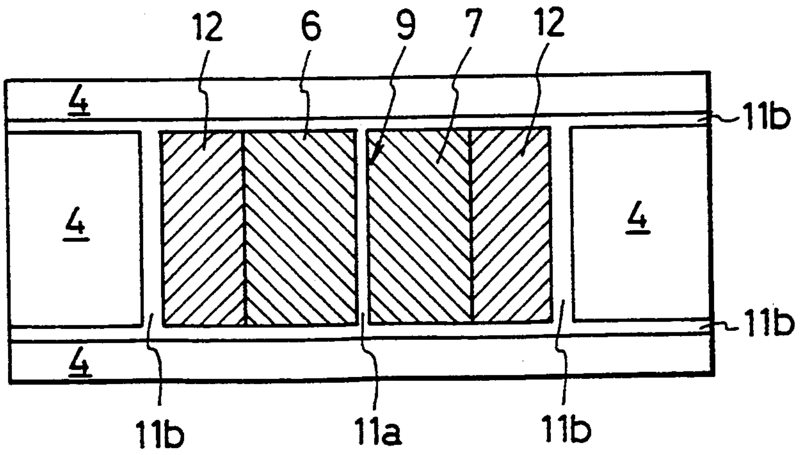

A vacuum device according to a first embodiment of the present invention has such a structure as shown in FIGS. 2E and 2F. On a single-crystal silicon substrate 3, a silicon oxide film 2 and a single-crystal silicon layer 1 are formed in this order. The multi-layer substrate is a so-called "SOI" substrate.

The (100)-plane oriented silicon layer 1 has at the center thereof a concavity whose cross-section is similar to a letter V. A groove 11*a* is formed at the bottom of the concavity and the silicon layer 1 is divided into two parts 6 and 7 by the groove 11*a*. The part 6 act as a cathode and the part 7 act as a gate. The layer 1 is isolated from the other devices (not shown) by grooves 11*b* which are formed around the cathode 6 and the gate 7. The bottoms of the grooves 11*a* and 11*b* are extended to the surface of the oxide film 2. In the embodiment, the substrate 3 act as an anode.

The surfaces of the cathode 6 and the gate 7 are covered with a metal film 12 such as aluminum or the like except for the two (111)-oriented oblique surfaces of the silicon layer 2. The oblique surfaces of the cathode 6 and the gate 7 are exposed. The surfaces of the silicon layer 1 outside the cathode 6 and the gate 7 are covered with silicon oxide films 4.

At a position just below the central groove 11*a*, there is a void 9 extending from one end of the groove 11*a* to the other one thereof in the oxide film 2. Electrons emitted from the tapered edge of the cathode 6 move through the void 9 toward the substrate 3 as the anode.

The vacuum device is set in an appropriate vacuum chamber and then, an voltage is applied between the cathode 6 and the substrate 3 and an voltage is applied between the cathode 6 and the gate 7 when used. The movement of the electrons from the cathode 6 toward the substrate 3 are controlled by the voltage applied to the gate 7, thereby an effective anode current being obtained.

The vacuum device having the above-described structure is fabricated according to the following processes:

First, as shown in FIG. 2A, a so-called SOI substrate is prepared, which is composed of the silicon oxide film 2 formed on the single-crystal silicon substrate 3, and the single-crystal silicon layer 1 formed on the oxide layer 2. Here, the silicon layer is of (100)-orientation and has a thickness of about 1$\mu$. The oxide layer 2 has a thickness of about 1$\mu$ and the substrate 3 has a thickness of about 500$\mu$.

Next, the silicon oxide film 4 is deposited on the silicon layer 1 by the CVD technique and thereafter, the central portion of the film 4 is selectively removed by the etching technique, thereby a rectangular window 5 being formed in the film 4, as shown in FIG. 2B.

The silicon layer 1 is then anisotropic etched using the film 4 with the window 5 as a mask, thereby the surface of the oxide film 2 being partially exposed from the layer 1. The etching solution used is, for example, hydrazine. As a result, the silicon layer 1 is selectively removed so that the layer 1 is divided into the cathode 6 and the gate 7 by the linear groove 11*a* and two (111)-oriented oblique surfaces are formed on the cathode 6 and the gate 7, respectively, as shown in FIG. 2C. Thus, the cathode 6 and the gate 7 with the tapered sharp edges are obtained.

The oxide film 2 is etched through the groove 11*a* to form the void 9 in the film 2, as shown in FIG. 2D. Then, the grooves 11*b* are formed by the reactive ion etching (RIE) technique to isolate the device from the other devices (not shown), as shown in FIGS. 2E and 2F. The metal films 12 such as aluminum are formed on the top surfaces of the cathode 6 and the gate 7 to apply voltages thereto.

In the embodiment, the silicon substrate 3 is used as the anode, however, the anode may be formed by the silicon layer 1 or an electorconductive film or the like. The grooves 11*a* and 11*b* may be formed in the etching process of the silicon layer 1.

In the embodiment, since the vacuum device is fabricated by utilizing the nature of silicon in the etching process, the cathode and the gate each having the sharp tapered edge can be obtained with a good reproduciability and without complex know-hows. Therefore, a large electric current can be supplied to the device as well as the positions of the edges can be set with accuracy and without restraint.

SECOND EMBODIMENT

Figure 3:
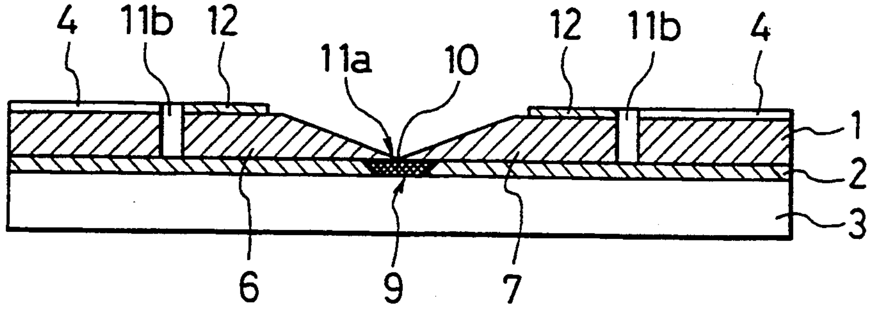
FIG. 3 is a cross-sectional view according to a second embodiment of the present invention, which has a light-emitting function.

In FIG. 3, a vacuum device of a second embodiment has a fluorescent material 10 such as zinc oxide or the like placed in the void 9 of the silicon oxide film 2. The structure of the device is the same as that of the first embodiment except for the fluorescent material 10 being provided.

In the second embodiment, the electrons emitted from the cathode 6 collide with the fluorescent material 10 thereby fluorescence being generated from the material 10. Thus, the device of the second embodiment act as a light-emitting device.

THIRD EMBODIMENT

Figure 4:
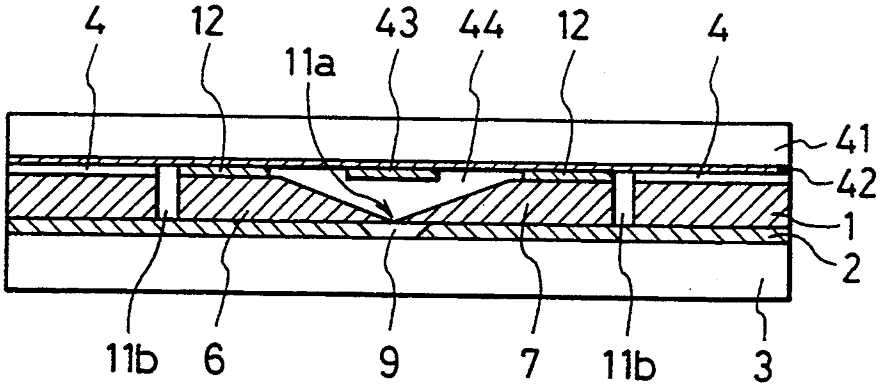
FIG. 4 is a cross-sectional view according to a third embodiment of the present invention, which has a light-emitting function.

A vacuum device of a third embodiment shown in FIG. 4 has the same structure as that of the first embodiment other than that a transparent glass plate 41 with a transparent electroconductive film 42 and a fluorescent material 43 is provided on the surfaces of the metal film 12 and the silicon oxide film 4. The patterned electroconductive film 42 is formed on the lower face of the plate 41 and the fluorescent material 43 is attached on the lower face of the film 42 at a position just above the groove 11*a*. The film 42 acts as the anode.

A space 44 surrounded by the cathode 6, the gate 7, the silicon substrate 3 and the glass plate 41 is sealed and made vacuum. The electrons emitted from the edge of the cathode 6 are accelerated in the space 44 and thereafter collide with the fluorescent material 43 thereby light being emitted. Therefore, there is an advantage that larger intensity of light can be emitted than that in the device of the first embodiment.

In case that the transparent electroconductive film 42 is thin enough for the electrons transmitting, the film 42 may be arranged at a position nearer to the cathode 6 and the gate 7 than the material 43. That is, the material 43 may be attached on the upper face of the film 42.

The device of this embodiment does not require to be placed in a vacuum atmosphere.

FOURTH EMBODIMENT

Figure 5:
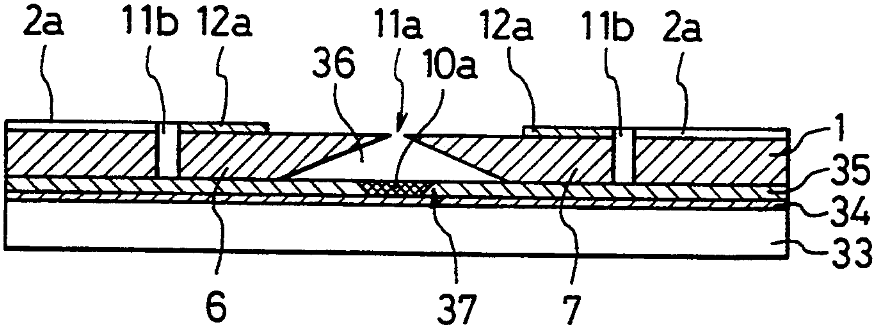
FIG. 5 is a cross-sectional view according to a fourth embodiment of the present invention, which has a light-emitting function.

A vacuum device of a fourth embodiment according to the invention shown in FIG. 5 is different from the above embodiments in that a transparent plate 33 is employed instead of the silicon substrate 3.

The plate 33 is made of transparent material such as glass and an electroconductive film 34 made of transparent material such as Indium Tin Oxide (ITO) is formed on the surface of the plate 33. A spacer 35 made of an insulator film such as silicon oxide or glass is formed on the film 34. The structure obtained by removing the metal film 12 and the silicon oxide film 4 from the vacuum device of the first embodiment is fixed on the spacer 35.

As shown in FIG. 5, in the fourth embodiment, the silicon layer 1 is turned upside down and the tapered edges of the cathode 6 and the gate 7 are positioned far from the spacer 35. The lower faces of the silicon layer 1 are contacted with the spacer 35. The upper faces of the layer 1 outside the grooves **11*b* are covered with silicon oxide films 2*a*, and the upper faces inside the grooves 11*b* are covered with metal films 12*a* except for an area just above a space 36 which is surrounded by the silicon layer 1 and the spacer 35**.

A fluorescent material **10*a* is placed in a void 37 which is formed in the spacer 35 and extends along the groove 11*a*. The electrons emitted from the cathode 6 are collide with the fluorescent material 10*a* thereby light being emitted on the way to the electroconductive film 34 as the anode in the space 36**.

Similar to the third embodiment, in case that the transparent electroconductive film 34 is thin enough for the electrons transmitting, the film 34 may be arranged at a position nearer to the cathode 6 than the material **10*a*. That is, the material 10*a* may be arranged under the film 34**.

An opaque film may be used as the film 34 if it is thin enough for the light transmitting.

The above-described vacuum device is fabricated according to the following processes.

First, the transparent film 34 is formed on the transparent plate 33 and the insulator spacer 35 is formed on the film 34. Then, the void 37 is formed in the spacer 35 by the etching technique.

On the other hand, by the same way as in the first embodiment, an element having the same structure as that in FIGS. 2E and 2F except for the metal film 12 and the silicon oxide film 4 being removed is fabricated.

Next, the silicon layer 1 of the element is bonded to the spacer 35 and then, the entire silicon substrate 3 is removed by the abrasion technique, so that the metal layers **12*a* and the silicon oxide films 2*a* are formed on the silicon layer 1**.

Thus, the device shown in FIG. 5 is obtained.

FIFTH EMBODIMENT

Figure 6:
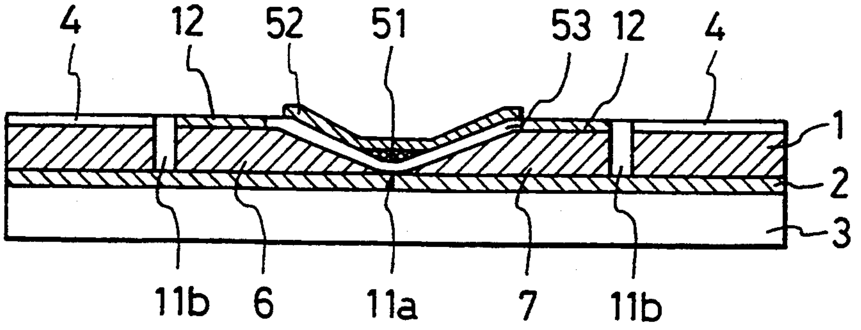
FIG. 6 is a cross-sectional view according to a fifth embodiment of the present invention, which has a light-emitting function.

In a electron emission device of a fifth embodiment shown in FIG. 6, the electrons emitted from the cathode 6 are accelerated without moving in a vacuum and collide with a fluorescent material 51 by using an extremely thin insulator film 53.

There is provided with the insulator film 53, which is much smaller in thickness than the distance between the edges of the cathode 6 and the gate 7, on the oblique surfaces of the silicon layer 1 and on the surface of the oxide film 2 exposed from the layer 1. On the film 53, the fluorescent material 51 is placed at a position just above the central groove **11*a*. In addition, on the film 53 and the material 51, a thin metal film 52 is formed so as to cover the entire surface of the film 53. The other structure is the same as that of the first embodiment except for the void not being formed in the silicon oxide film 2**.

The electrons emitted from the cathode 6 are accelerated in the thin insulator film 53 and collide with the fluorescent material 51.

Similar to the third embodiment, in case that the metal film 52 as the anode is several tens nanometers or less in thickness so that the electrons may transmit, the material 51 may be arranged on the film 52.

SIXTH EMBODIMENT

Figure 7A:
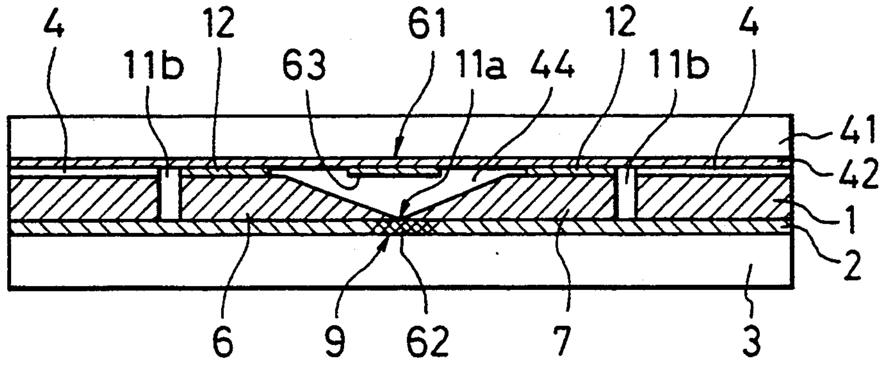
FIG. 7A is a cross-sectional view according to a sixth embodiment of the present invention, which has a laser function.

A vacuum device of a sixth embodiment shown in FIG. 7A has a pair of mirrors which form an optical resonator and are arranged at both sides of the fluorescent material, respectively.

The vacuum device of this embodiment has the same structure as that of the third embodiment shown in FIG. 4 except that a thinner sheet-like fluorescent material 63 than the fluorescent material 43 is provided on the lower face of the transparent electrode 42, that a first mirror 61 also acting as the anode is provided in the electrode 42 made of electroconductive film, and that a second mirror 62 made of an aluminum film which is formed on the surface of the silicon substrate 3 in the void 9 of the silicon oxide film 2. The first and second mirrors 61 and 62 constitute an optical resonator for light generated in the material 63.

Since the transmittance of the first mirror 61 is larger than that of the second mirror 62, the laser light obtained by resonance of the light generated from the fluorescent material 63 exits upward through the transparent plate 41 in the direction perpendicular to the substrate 3.

If the fluorescent material 63 used is properly selected, laser light of a wavelength range which is impossible to be gotten by the conventional laser device can be obtained. Besides, the resonance frequency of a resonance circuit and the oscillation frequency of the optical resonator can be set equal or nearly equal to each other, so that laser oscillation can be realized easily as well as the laser oscillation can be performed with good efficiency.

SEVENTH EMBODIMENT

Figure 7B:
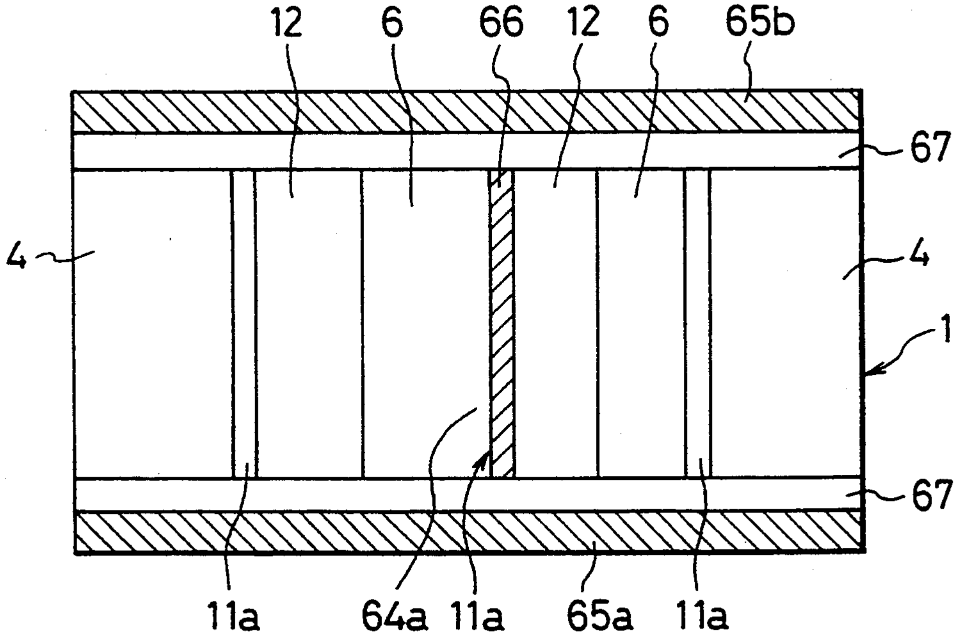
FIG. 7B is a cross-sectional view according to a seventh embodiment of the present invention, which has a laser function.

A vacuum device of a seventh embodiment shown in FIG. 7B has a pair of mirrors **65*a* and 65*b* which form an optical resonator and are arranged at both sides of a fluorescent material 66, respectively. The material 66 is placed in the void 9 of the oxide film 2. Laser light exits from the resonator in the direction parallel to the silicon layer 1**.

The vacuum device of this embodiment has the same structure as that of the sixth embodiment shown in FIG. 7A except that the mirror **65*a* and 65*b* are formed by the silicon layer 1 and that the fluorescent materials 63** is not provided.

The mirrors **65*a* and 65*b* are made of the silicon layer 1, which are formed by making two grooves 67 in the substrate 1 using the RIE technique. If the depth of the grooves 67 varies, the transmittance of the mirrors 65*a* and 65*b*** can be changed.

The mirror **65*a* is higher in transmittance than that of the mirror 65*b*, laser light exit from the device, the laser light obtained by resonance of the light generated from the fluorescent material 66 exits through the silicon layer 1 in the direction parallel to the layer 1 along the groove 11*a***.

In the above embodiments, the gate 7 has the same sharp tapered edge as that of the cathode, however, the other configuration of the gate 7 may be other one such as an end face perpendicular to the layer 1.

If the gate 7 is provided, the output of the device can be controlled and modulated by using the gate 7 easily, however, no gate may be provided because the control and modulation of the output can be performed to some degree by changing the voltage applied to the cathode 6.

In case that no gate is provided, for example, the same voltage as that applied to the cathode 6 may be applied to the gate 7 in the vacuum device shown in FIG. 3, which means that 1the gate 7 act as the cathode.

Thus, the cathode is of a symmetrical configuration about the groove 11*a*.

It is to be understood that the present invention is not limited to the embodiment except as defined in the appended claims.

What is claimed is:

1. A vacuum device comprising:

a semiconductor substrate;

an insulator film formed on said substrate;

a single-crystal semiconductor film formed on said insulator film;

said single-crystal semiconductor film having first and second tapered edges opposite to each other, said first and second edges being spaced apart from each other by a groove;

said insulator film having a gap juxtaposed with said groove;

said first and second tapered edges of said single-crystal semiconductor layer being formed by anisotropically etching said semiconductor layer from an opposite side to said substrate taking a crystal plane of said semiconductor layer into consideration;

said first tapered edge acting as a cathode from which electrons are emitted under an electric field;

said substrate acting as an anode into which said electrons emitted from said cathode flow; and said second tapered edge acting as a gate for controlling a flow of said electrons emitted from said cathode;

wherein said electrons emitted from said cathode flow through said groove and gap into said anode under said electric field in a vacuum atmosphere.

2. The vacuum device according to claim 1, wherein a fluorescent material is placed in said gap so that said electrons emitted from said cathode flow toward said anode to collide with said fluorescent material thereby generating light.

3. The vacuum device according to claim 2, wherein a pair of mirrors forming an optical resonator is provided and said fluorescent material is placed between said pair of said mirrors along an optical path normal to said pair of mirrors and an imaginary line interconnecting said first and second tapered edges, each of said mirrors being spaced along said optical path away from said fluorescent material and said first and second tapered edges.

4. A vacuum device comprising:

a semiconductor substrate;

an insulator film formed on said substrate;

a single-crystal semiconductor film formed on said insulator film;

said single-crystal semiconductor film having first and second tapered edges opposite to each other, said first and second edges being spaced apart from each other by a groove;

said insulator film having a gap juxtaposed with said groove;

said first and second tapered edges of said single-crystal semiconductor layer being formed by anisotropically etching said semiconductor layer from an opposite side to said substrate taking a crystal plane of said semiconductor layer into consideration;

said first tapered edge acting as a cathode from which electrons are emitted under an electric field;

a supporting plate having an electroconductive film acting as an anode into which said electrons emitted from said cathode flow, said supporting plate being placed at an opposite side to said substrate; and said second tapered edge acting as a gate for controlling a flow of said electrons emitted from said cathode;

wherein said electrons emitted from said cathode flow through a space formed between said first and second tapered edges and said supporting plate into said anode under said electric field.

5. The vacuum device according to claim 4, wherein said space is in vacuum and said electrons flow through said vacuum space into said anode under said electric field.

6. The vacuum device according to claim 4, further comprising a fluorescent material placed on said supporting plate adjacent said space wherein said anode and said supporting plate are transparent so that light from said fluorescent material is emitted from said space through said anode and said supporting plate.

7. The vacuum device according claim 4, further comprising a fluorescent material placed on said supporting plate adjacent said space and a pair of mirrors forming an optical resonator wherein said fluorescent material is placed between said pair of said mirrors along an optical path normal to said pair of mirrors and an imaginary line interconnecting said first and second tapered edges, each of said mirrors being spaced along said optical path away from said fluorescent material and said first and second tapered edges.

8. The vacuum device according to claim 4, further comprising a fluorescent material placed on said supporting plate, wherein said electrons flow through said space into said anode to thereby collide with said fluorescent material and emit light.

9. An electron emission device comprising:

a semiconductor substrate;

a first insulator film formed on said substrate;

a single-crystal semiconductor film formed on said first insulator film;

said single-crystal semiconductor film having first and second tapered opposite to each other, said first and second edges being spaced apart from each other by a groove;

said first and second tapered edges of said single-crystal semiconductor layer being formed by anisotropically etching said semiconductor layer from an opposite side to said substrate taking a crystal plane of said semiconductor layer into consideration;

said first tapered edge acting as a cathode from which electrons are emitted under an electric field;

a second insulator film placed at an opposite side to said substrate to cover said first and second tapered edges;

an electroconductive film acting as an anode into which said electrons emitted from said cathode flow, said electroconductive film being placed on said second insulator film; and said second tapered edge acting as a gate for controlling a flow of said electrons emitted from said cathode;

wherein said electrons emitted from said cathode flow through said second insulator film into said anode under said electric field.

* * * * *